(12) United States Patent
Bozzer et al.

(10) Patent No.: US 7,515,219 B2
(45) Date of Patent: Apr. 7, 2009

(54) ELECTROMAGNETIC SHIELD FOR DISPLAY

(75) Inventors: Erich Bozzer, Romulus, MI (US); Jon P. Bay, Saline, MI (US); Raymond J. Duce, Saline, MI (US); Joseph N. Kramer, Farmington, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 327 days.

(21) Appl. No.: 11/435,630

(22) Filed: May 17, 2006

(65) Prior Publication Data

US 2007/0268424 A1    Nov. 22, 2007

(51) Int. Cl.
*G02F 1/1333* (2006.01)

(52) U.S. Cl. ............................. 349/56; 349/58; 349/59; 349/61

(58) Field of Classification Search .................... 349/56, 349/58–59, 61, 70; 345/75.1
See application file for complete search history.

(56) References Cited

U.S. PATENT DOCUMENTS

| | | | |
|---|---|---|---|
| 4,412,255 A | 10/1983 | Kuhlman et al. | |
| 4,602,164 A | 7/1986 | Gore et al. | |
| 5,705,860 A | 1/1998 | Ninh et al. | |
| 5,831,816 A | 11/1998 | Johns et al. | |
| 6,020,867 A | 2/2000 | Shimada et al. | |
| 6,150,754 A | 11/2000 | Yoshikawa et al. | |
| 6,483,719 B1 | 11/2002 | Bachman | |
| 6,532,152 B1 | 3/2003 | White et al. | |
| 6,624,536 B1 | 9/2003 | Sawada et al. | |
| 6,884,936 B2 | 4/2005 | Takahashi et al. | |
| 6,914,380 B2 | 7/2005 | Uemura et al. | |
| 2002/0003571 A1 | 1/2002 | Schofield et al. | |
| 2002/0043607 A1 | 4/2002 | Tajima | |
| 2002/0135294 A1 | 9/2002 | Fujishiro et al. | |
| 2004/0195235 A1 | 10/2004 | Kim et al. | |
| 2005/0018248 A1 | 1/2005 | Silverbrook | |
| 2005/0024573 A1 | 2/2005 | Suzuki | |
| 2005/0073632 A1 | 4/2005 | Dunn et al. | |
| 2006/0033872 A1* | 2/2006 | Sasuga et al. ................ | 349/149 |

FOREIGN PATENT DOCUMENTS

| | | |
|---|---|---|
| EP | 0503184 | 9/1992 |
| EP | 0534372 | 3/1993 |

* cited by examiner

*Primary Examiner*—Brian Healy
*Assistant Examiner*—Michael P Mooney
(74) *Attorney, Agent, or Firm*—Brinks Hofer Gilson & Lione

(57) ABSTRACT

An electromagnetic shielding system including a circuit board, a display and a shield is described. The shield includes a face having an opening through which the display is visible. A wall portion extends from the face of the shield towards the circuit board. As a result, the display is substantially encapsulated between the circuit board, the shield and the wall portion.

13 Claims, 2 Drawing Sheets

ELECTROMAGNETIC SHIELD FOR DISPLAY

BACKGROUND

1. Field of the Invention

The present invention generally relates to electromagnetic shielding of display systems and, more particularly, to the electromagnetic shielding of vacuum fluorescent display systems.

2. Description of the Know Technology

Display systems, such as vacuum fluorescent display systems, may be coupled to a circuit board. The display system is one of many components populating the circuit board. A vacuum fluorescent display (VFD) is a type of display used primarily on consumer electronic equipment such as head unit for automobile entertainment systems. Unlike liquid crystal displays (LCD), a VFD emits a very bright light with clear contrast. Because the VFD emits a very bright light, the VFD is easily seen by a user even when an external light source, such as the sun, is shinning directly on the display. This contrasts to LCDs which, in some applications, have a tendency of becoming difficult for the user to see when an external light source is directly shining on the display.

However, VFDs have drawbacks compared to their LCD counterparts. VFDs typically use more electricity than similar size LCDs. In applications such as vehicle entertainment systems, the electricity drawn by the display is not a concern because the electrical system of the vehicle produces more than an adequate amount of electricity to properly power the VFD. Additionally, complex VFDs also have the drawback of producing a large electromagnetic field. This large electromagnetic field is a greater concern since it may interfere with other electronic components populating the circuit board or electronic modules in the vicinity.

Accordingly, there is a need for a system that shields electronic components populating the circuit board from the electromagnetic field produced by a VFD display.

SUMMARY

In overcoming the drawbacks and limitations of the known technologies, a system for shielding electronic components from a VFD display is disclosed. While particularly shown and described in conjunction with a VFD display, it is apparent that the system can be used with other types of displays. The system includes a circuit board, a shield and a display. The display includes a front side and a back side. The backside of the display is mounted to a mounting area of the circuit board while the front side of the display has a display area for displaying characters, such as numbers and letters, and graphics. The shield includes a face having an opening. The shield is located adjacent to the display such that the opening is located above the viewing area of the display. A wall portion extends from the face of the shield towards the circuit board, thereby substantially encapsulating the display between the circuit board, the shield and the wall portion.

These and other advantages, features and embodiments of the invention will become apparent from the drawings, detailed description and claims which follow.

DETAILED DESCRIPTION

Figure 1:
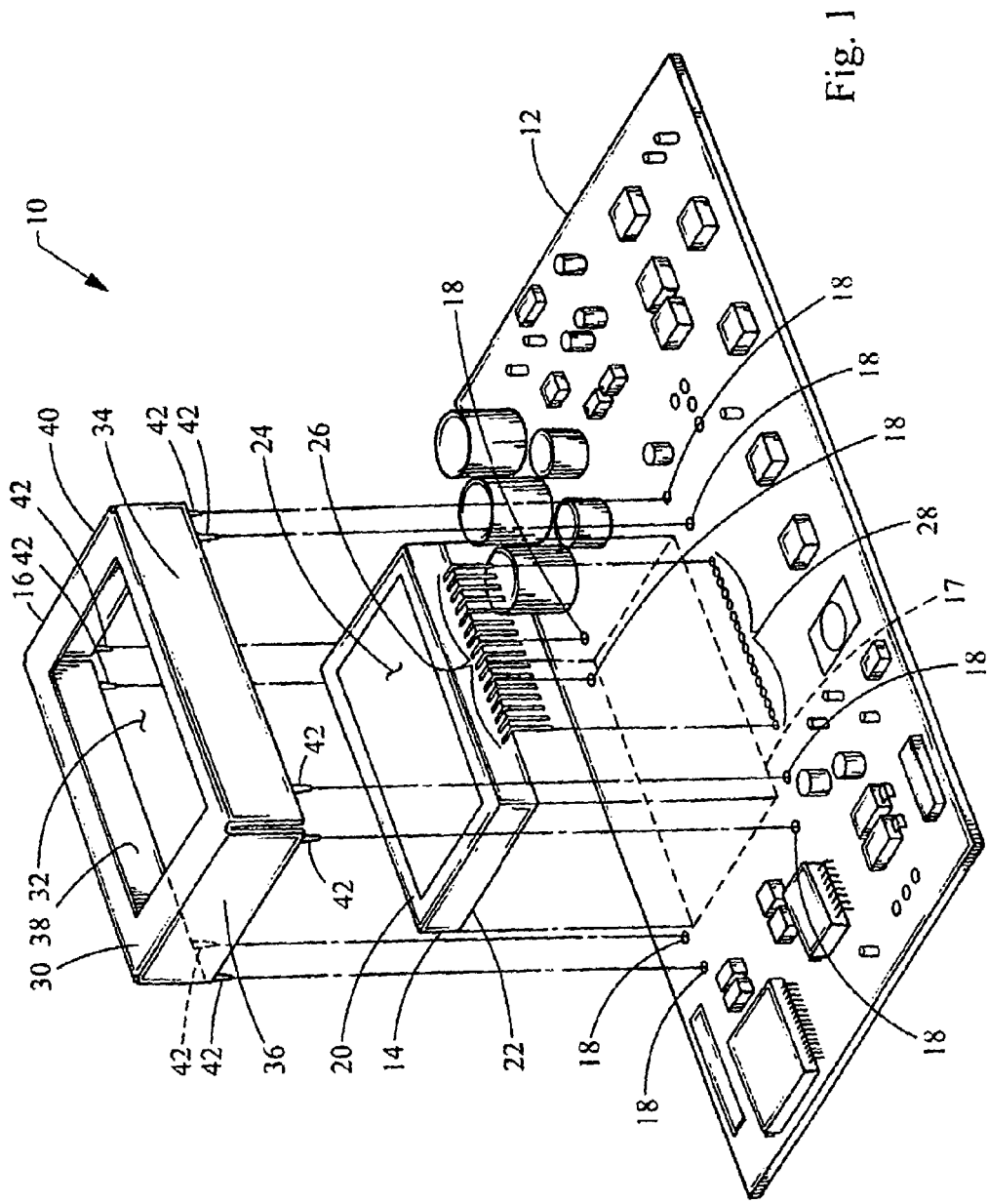
FIG. 1 is an exploded view of a system for shielding electronic components embodying the principles of the present invention.
Figure 2:
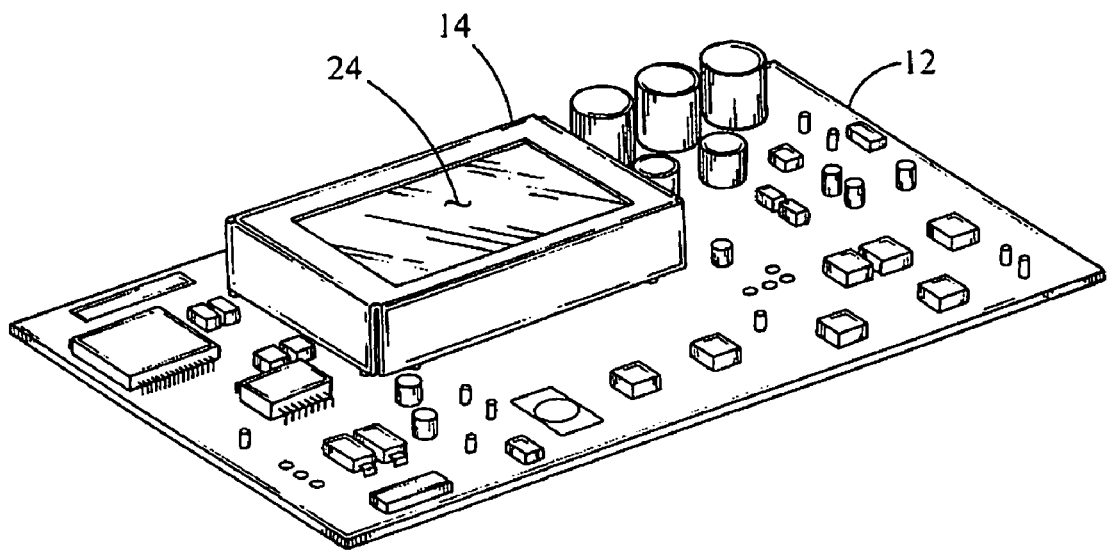
FIG. 2 is a perspective view of the system for shielding electronic components embodying the principles of the present invention.

Referring to FIGS. 1 and 2, a system 10 for shielding electronic components is shown. The system 10 includes as its main components a circuit board 12, a display 14 and a shield 16. The circuit board 12 is of a typical construction and may be any circuit board attached to a display. Such circuit boards commonly found in the head unit of an automobile entertainment system, an alarm clock or a calculator.

While populated with other various electronic components, the circuit board 12 includes a mounting area 17 delineating the location of where the display 14 is to be placed on the circuit board 12. The circuit board 12 also includes a plurality of locking points 18. As will be described later in more detail, the plurality of locking points 18 will serve to aid in the anchoring of the shield 16 to the circuit board 12. It should be understood that although a plurality of locking points 18 are shown, a singular locking point may be utilized. To achieve this purpose, each locking point 18 is illustrated as being a through-hole, defined by the circuit board 12 that extends through the thickness of the circuit board 12.

The display 14 includes a front side 20 and a back side 22; the front side 20 of which includes a display area 24. When in use, the display area 24 may display characters, such as numbers and letters, or graphics. Typically, the display 14 is contemplated as being a vacuum fluorescent display (VFD), but may be any type of display including, but not limited to, a liquid crystal display. The backside 22 of display 14 is placed above the mounting area 16 of the circuit board 12. The display 14 also includes a display connector 26, which may be a plurality of pins.

The circuit board 12 includes an electrical contact area 28 made up of a plurality of electrical contacts. When the backside 22 of the display 14 is mounted to the mounting area 17, the display connector 26 is in electrical communication with the electrical contact 28, which provides from the circuit board 12 and/or other components requisite electrical signals to the display 14 via the display connector 26. The electrical signals may instruct the display 14 to display characters, numbers or graphics in the display area 24.

The shield 16 includes a face 30 defining an opening 32. The shield 16 also includes wall portions 34, 36, 38, 40 extending substantially perpendicular from the face 30. The wall portions 34, 36, 38, 40 include at least one locking peg 42. The shield 16 may be made of tin nickel, iron, tin, steel, aluminum or combination thereof or any material suitable for suppressing an electromagnetic field generated by the display 14. The shield 16 is coupled to the circuit board 12 such that the locking pegs 42 mechanically engage the locking points 18 of the circuit board 12 thereafter, the opening 32 of the shield 16 will allow a user to view the viewing area 24 of the display 16 through the opening 32.

Generally, the locking pegs 42 extend through the thickness of the circuit board 12 when inserted into the mounting points 18. The locking pegs 42 may attach to the portions of the circuit board 12 forming the locking points 18 by frictional engagement, an adhesive or any other suitable method. The adhesive may be a glue or a solder.

Figure 3:
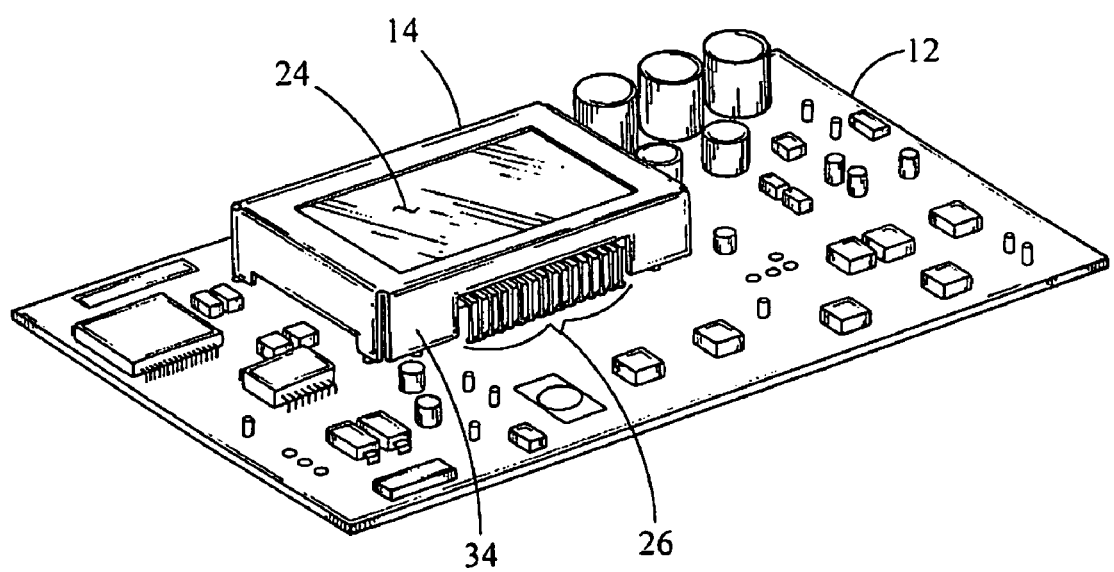
FIG. 3 is a perspective view of the system for shielding electronic components, the system having a wall portion defining an opening.

Referring to FIG. 3, another embodiment of the system 10' for shielding electronic components as shown. This embodiment is similar to the embodiment shown in FIG. 1 with the exception that the wall portion 34 has a portion removed thereby defining an opening 44. The opening 44 allows access to the display connector 26 and the electrical contact 28.

The foregoing disclosure is the best mode devised by the inventors for practicing this invention. It is apparent, however, that methods incorporating modifications and variations will be obvious to one skilled in the art of electromagnetic shielding of display systems and more particularly to electromagnetic shielding of vacuum fluorescent display systems. Inasmuch as the foregoing disclosure is intended to enable one skilled in the pertinent art to practice the instant invention, it should not be construed to be limited thereby but should be construed to include such aforementioned obvious variations and be limited only by the spirit and scope of the following claims.

The invention claimed is:

1. A system for shielding electronic components, the system comprising:
    a circuit board having a locking point and a front side, the front side of the circuit board having a mounting area;
    a display having a front side and a back side, the front side having a viewing area, the back side located flush with the mounting area; and
    a shield located adjacent to the display, the shield having at least one wall portion and a face defining an opening for viewing the viewing area of the display, the wall portion extending at an angle from the face of the shield, the wall portion having a locking peg in mechanical engagement with the locking point, whereby the circuit board, the shield and the wall portion substantially encapsulate the display;
    wherein the locking point is an aperture defined by the circuit board, the aperture extending through the thickness of the circuit board; and
    wherein the area defined by the face of the shield is less than the area defined by the front side of the circuit board.

2. The system of claim 1, wherein the circuit board further comprises an electrical contact and the display further comprises a display connector, the display connector being in electrical communication with the electrical contact.

3. A system for shielding electronic components, the system comprising:
    a circuit board having a mounting area and a locking point;
    a display having a front side and a back side, the front side having a viewing area, the back side located adjacent to the mounting area; and
    a shield located adjacent to the display, the shield having at least one wall portion and a face defining an opening for viewing the viewing area of the display, the wall portion extending at an angle from the face of the shield, the wall portion having a locking peg in mechanical engagement with the locking point, whereby the circuit board, the shield and the wall portion substantially encapsulate the display;
    wherein the circuit board further comprises an electrical contact and the display further comprises a display connector, the display connector being in electrical communication with the electrical contact; and
    wherein the wall portion defines an opening adjacent to the display connector, whereby the opening allows access to the display connector.

4. The system of claim 1, wherein the display is a vacuum florescent display.

5. The system of claim 1, wherein the shield is made of nickel, iron, tin, steel, aluminum or combination thereof.

6. The system of claim 1, wherein the wall portion is substantially perpendicular to the face.

7. The system of claim 1, wherein the wall portion further comprises a plurality of wall portions generally encircling the face.

8. The system of claim 7, wherein the plurality of wall portions each have at least one locking peg and the circuit board further comprises a plurality of locking points, whereby each locking peg is in mechanical engagement with one of the plurality of locking points.

9. The system of claim 1, wherein the locking peg is located within the aperture.

10. The system of claim 9, wherein the locking peg frictionally engages portions of the circuit board defining the aperture, thereby attaching the locking peg to the portion of the circuit board defining the aperture.

11. The system of claim 9, further comprising a retaining material located within the aperture between the locking peg and the portion of the circuit board defining the aperture, whereby the retaining material attaches the locking peg to the portion of the circuit board defining the aperture.

12. The system of claim 11, wherein the retaining material is solder.

13. The system of claim 11, wherein the retaining material is an adhesive.

* * * * *